US010606168B2

(12) United States Patent
Wang et al.

(10) Patent No.: US 10,606,168 B2
(45) Date of Patent: Mar. 31, 2020

(54) MASK, MASKING EXPOSURE METHOD, MASK SYSTEM AND PATTERN CONTROL DEVICE

(71) Applicant: BOE TECHNOLOGY GROUP CO., LTD., Beijing (CN)

(72) Inventors: Wei Wang, Beijing (CN); Zhongyuan Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 8 days.

(21) Appl. No.: 15/522,276

(22) PCT Filed: May 6, 2016

(86) PCT No.: PCT/CN2016/081240
§ 371 (c)(1),
(2) Date: Apr. 26, 2017

(87) PCT Pub. No.: WO2017/143662
PCT Pub. Date: Aug. 31, 2017

(65) Prior Publication Data
US 2018/0095360 A1 Apr. 5, 2018

(30) Foreign Application Priority Data
Feb. 25, 2016 (CN) .......................... 2016 1 0105769

(51) Int. Cl.
*H01L 21/67* (2006.01)
*G03F 1/60* (2012.01)
(Continued)

(52) U.S. Cl.
CPC .................. *G03F 1/60* (2013.01); *G03F 1/14* (2013.01); *G03F 7/20* (2013.01); *H01L 27/3241* (2013.01)

(58) Field of Classification Search
CPC ..... G03F 1/60; G03F 1/14; G03F 1/00; G03F 7/20
See application file for complete search history.

(56) References Cited

U.S. PATENT DOCUMENTS 4,050,814 A 9/1977 McFadden
5,110,698 A 5/1992 Hara et al.
(Continued)

FOREIGN PATENT DOCUMENTS

CN 101813881 A 8/2010
CN 1840149 A 9/2010
(Continued)

OTHER PUBLICATIONS

International Search Report and Written Opinion (including English translation of Box V.) dated Nov. 28, 2016, for corresponding PCT Application No. PCT/CN2016/081240.
(Continued)

*Primary Examiner* — Cuong B Nguyen
*Assistant Examiner* — Samuel Park
(74) *Attorney, Agent, or Firm* — Kinney & Lange, P.A.

(57) ABSTRACT

Embodiments of the present disclosure relate to a mask, a masking exposure method, a mask system and a pattern control device. The mask according to embodiments of the present disclosure includes a pattern control layer and a light conversion layer. The pattern control layer includes a plurality of light-transmission units and a control circuit connected to each of the light-transmission units. The control circuit is configured to control conversion of each of the light-transmission units between in a light-transmission state and in a light-tight state, such that different mask patterns are formed. The light conversion layer is provided on a light-outgoing directional side or a light-incoming directional side of the pattern control layer and is configured to convert
(Continued)

incoming light into parallel light so as to emit the parallel light.

19 Claims, 2 Drawing Sheets

(51) Int. Cl.
  *H01L 27/32* (2006.01)
  *G03F 7/20* (2006.01)
  *G03F 1/00* (2012.01)

(56) References Cited

U.S. PATENT DOCUMENTS

| | | | | |
|---|---|---|---|---|
| 6,291,110 | B1* | 9/2001 | Cooper | G03F 7/70291 430/5 |
| 6,994,939 | B1* | 2/2006 | Ghandehari | G03F 1/30 430/311 |
| 2004/0252361 | A1* | 12/2004 | Machida | G02B 26/026 359/296 |
| 2006/0181500 | A1* | 8/2006 | Murade | G02F 1/136204 345/100 |
| 2007/0199201 | A1* | 8/2007 | Tanaka | G03F 7/70808 34/92 |
| 2008/0137032 | A1* | 6/2008 | Lawrence | B29D 11/00355 351/159.61 |
| 2008/0174851 | A1* | 7/2008 | Kawai | G02F 1/13624 359/296 |
| 2009/0023609 | A1* | 1/2009 | Jung | B01J 19/0046 506/32 |
| 2011/0255064 | A1* | 10/2011 | Conraux | G03F 7/70291 355/53 |
| 2012/0242565 | A1* | 9/2012 | Noh | G02F 1/167 345/107 |
| 2013/0208338 | A1* | 8/2013 | Wang | G02F 1/167 359/296 |
| 2013/0321911 | A1* | 12/2013 | Yamayoshi | G02B 27/2214 359/462 |
| 2014/0055718 | A1* | 2/2014 | Li | H01L 27/3232 349/69 |
| 2016/0025992 | A1* | 1/2016 | Van Der Zouw | G01N 21/8806 250/216 |
| 2017/0025247 | A1* | 1/2017 | Stevens | H01J 37/222 |

FOREIGN PATENT DOCUMENTS

| | | |
|---|---|---|
| CN | 101840149 A | 9/2010 |
| CN | 102142362 A | 8/2011 |
| CN | 102466963 | 5/2012 |
| CN | 102645835 A | 8/2012 |
| CN | 102645838 A | 8/2012 |
| CN | 202443226 U | 9/2012 |
| CN | 104076613 A | 10/2014 |
| CN | 105549319 A | 5/2016 |

OTHER PUBLICATIONS

First Chinese Office Action dated Mar. 25, 2019, for corresponding Chinese Application No. 201610105769.9.

* cited by examiner

MASK, MASKING EXPOSURE METHOD, MASK SYSTEM AND PATTERN CONTROL DEVICE

CROSS-REFERENCE TO RELATED APPLICATION

This application claims the benefit of Chinese Patent Application No. 201610105769.9 filed on Feb. 25, 2016 in the State Intellectual Property Office of China, the whole disclosure of which is incorporated herein by reference.

BACKGROUND

1. Technical Field

Embodiments of the present invention relate to the field of display technology, and particularly to a mask, a masking exposure method, a mask system and a pattern control device.

2. Description of the Related Art

In manufacture process of a display device, a mask is usually adopted for exposure and development. For example, a process of packaging substrates with sealant is involved in the manufacturing of an Organic Light-Emitting Diode (OLED) device. This process generally includes, firstly coating a sealant onto one substrate, then assembling another substrate with the one substrate, and finally performing a radiation curing of the sealant using a mask. Commonly, one mask is only in correspondence with one mask pattern. In case that a new product is needed to be manufactured, it needs to develop and fabricate a new mask, which results in relatively high in cost.

SUMMARY

According to a first aspect of embodiments of the present invention, there is provided a mask, comprising:

a pattern control layer comprising a plurality of light-transmission units and a control circuit connected to each of the light-transmission units, the control circuit being configured to control conversion of each of the light-transmission units between in a light-transmission state and in a light-tight state such that different mask patterns are formed; and a light conversion layer provided on a light-outgoing directional side or a light-incoming directional side of the pattern control layer and configured to convert incoming light into parallel light so as to emit the parallel light.

In some embodiments, each of the light-transmission units comprises a container, and electrically charged and shading particles provided in the container, and a first electrode, a second electrode, a third electrode and a fourth electrode provided on an inner wall, that is perpendicular to a light-incoming direction, of the container; wherein the container is divided into a light-transmission region and a shading region;

the first electrode and the second electrode are located within the shading region of the container, and the third electrode and the fourth electrode are located within the light-transmission region of the container; the first, second, third and fourth electrodes are parallel to one another, the first electrode is located at a side of the shading region away from the light-transmission region, the second electrode is located at a side of the shading region adjacent to the light-transmission region, the third electrode is located at a side of the light-transmission region adjacent to the shading region, and, the fourth electrode is located at a side of the light-transmission region away from the shading region; and the control circuit is connected to the first electrode, the second electrode, the third electrode and the fourth electrode of each of the light-transmission units, and is configured to control voltages applied on the respective electrodes.

In some embodiments, the electrically charged and shading particles comprise $TiO_2$ particles.

In some embodiments, the electrically charged and shading particles comprises positively charged particles.

In some embodiments, the control circuit comprises a plurality of control sub-circuits, each being formed within the shading region of a corresponding one of the light-transmission units.

In some embodiments, the light conversion layer comprises a first conversion layer, a second conversion layer located at a light-outgoing directional side of the first conversion layer and a third conversion layer located at a light-outgoing directional side of the second conversion layer;

the first conversion layer is in a surface grinding design and is configured to diverge light incident on the first conversion layer into a surface light source and emit light from the surface light source to the second conversion layer;

the second conversion layer is configured to converge the light emitted from the first conversion layer into a plurality of point light sources and project the plurality of point light sources onto the third conversion layer; and the third conversion layer comprises a plurality of lenses being in an one-to-one correspondence with the point light sources and configured to convert the lights emitted from the respective point light sources into parallel light and emit the parallel light.

In some embodiments, the first conversion layer comprises a glass substrate, the second conversion layer is formed on the glass substrate by means of a film formation process, and the pattern control layer is formed on the second conversion layer by means of a film formation process.

According to a second aspect of embodiments of the present invention, there is provided a mask system, comprising: a vacuum chamber and a display substrate supporting table, wherein, a wall of the vacuum chamber facing rightly a table top of the display substrate supporting table is formed with a mask window that corresponds in position to the display substrate supporting table; and the system further comprises a first quartz substrate, a second quartz substrate and the mask of any one of the abovementioned embodiments; wherein, the first quartz substrate is configured to cover the mask window, the mask is provided on a face of the first quartz substrate facing away from the display substrate supporting table, and the second quartz substrate is provided on a face of the mask facing away from the first quartz substrate.

In some embodiments, a thickness of the first quartz substrate is greater than a thickness of the second quartz substrate.

According to a third aspect of the present invention, there is provided a masking exposure method using the mask of any one of the abovementioned embodiments, the method comprising:

controlling, by means of the control circuit, each of the light-transmission units respectively, to make the mask to form a required mask pattern.

In some embodiments, the method comprises:

moving and distributing evenly the electrically charged and shading particles between the third electrode and the fourth electrode and restricting the electrically charged and shading particles within the light-transmission region in a manner of changing voltages on the first, second, third and fourth electrodes when one light-transmission unit is required to be switched to be in a shading state; and moving the electrically charged and shading particles into the shading region and restricting the electrically charged and shading particles within the shading region in a manner of changing voltages on the first, second, third and fourth electrodes when one light-transmission unit is required to be switched to be in the light-transmission state.

According to a fourth aspect of embodiments of the present invention, there is provided a pattern control device, configured to use the mask of any one of the abovementioned embodiments to implement a pattern control, the pattern control device comprising:

a pattern control unit configured to control, by means of the control circuit, each of the light-transmission units respectively, to make the mask to form a required mask pattern.

BRIEF DESCRIPTION OF THE DRAWINGS

These characteristics and advantages of the present invention will become apparent and more readily appreciated taken in conjunction with the accompanying drawings, and the accompanying drawings are presented schematically and should not be understood to restrict the present invention. In these drawings.

DETAILED DESCRIPTION OF THE EMBODIMENTS

Figure 1:
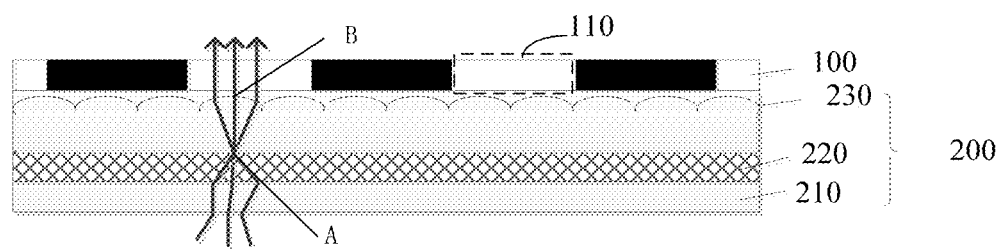
FIG. 1 is an overall structural schematic view of a mask according to an embodiment of the present invention.

In order to provide a more clear understanding of objects, features and advantages of the present invention, embodiments of the present invention will be further described hereinafter in detail and completely with reference to the attached drawings. It should be noted that, in the absence of conflictions, these embodiments of the present invention and these features of the embodiments can be combined.

In order to provide a full understanding of the present invention, lots of details are explained and illustrated in the following description. However, the present invention can be implemented by other manners which are different from these in this description, accordingly, the scope of the present invention should not be restricted by these following disclosed embodiments.

According to a first aspect of embodiments of the present invention, there is provided a mask comprising a pattern control layer and a light conversion layer. The pattern control layer comprises a plurality of light-transmission units and a control circuit connected to each of the light-transmission units, the control circuit is configured to control conversion of each of the light-transmission units between in a light-transmission state and in a light-tight state such that different mask patterns are formed; and, a light conversion layer is provided on a light-outgoing directional side or a light-incoming directional side of the pattern control layer and is configured to convert incoming light into parallel light so as to emit the parallel light.

With the mask according to embodiments of the present invention, the light-transmission units are controlled by means of the control circuit, so that the mask can provide different mask patterns, to allow the mask to be used in different patterning processes, so as to reduce the cost required for manufacturing the mask.

Moreover, with the mask according to embodiments of the present invention, provision of the light conversion layer, which is configured to convert incoming light into parallel light so as to emit the parallel light, on the light-outgoing directional side or the light-incoming directional side of the pattern control layer is in a good control of locations of the lights incident on the exposed substrate, to improve accuracy of the exposure.

It should be understood that, herein, the control circuit being configured to control conversion of each of the light-transmission units between in a light-transmission state and in a light-tight state, such that different mask patterns are formed means: the control circuit can implement an independent control of each of the light-transmission units, and state of each of the light-transmission units will not be affected by other light-transmission units, so that, the light-transmission units can be controlled by the control circuit, to allow the light-transmission units to constitute various different mask patterns.

According to a second aspect of embodiments of the present invention, there is provided a mask system comprising: a vacuum chamber and a display substrate supporting table, wherein, a wall of the vacuum chamber facing rightly a table top of the display substrate supporting table is formed with a mask window that corresponds in position to the display substrate supporting table; and the system further comprises a first quartz substrate, a second quartz substrate and the mask according to the first aspect; wherein, the first quartz substrate is configured to cover the mask window, the mask is provided on a face of the first quartz substrate facing away from the display substrate supporting table, and the second quartz substrate is provided on a face of the mask facing away from the first quartz substrate.

According to a third aspect of embodiments of the present invention, there is provided a masking exposure method using the mask according to the first aspect, and the method comprises: controlling, by means of the control circuit, each of the light-transmission units respectively, to make the mask to form a required mask pattern.

According to a fourth aspect of embodiments of the present invention, there is provided a pattern control device configured to use the mask of according to the first aspect to implement a pattern control, and the pattern control device comprises: a pattern control unit configured to control, by means of the control circuit, each of the light-transmission units respectively, to make the mask to form a required mask pattern.

That is to say, in specific implementations, the masking exposure method mentioned herein can be achieved by means of using a corresponding pattern control device. Specifically, a pattern control unit may be provided in the pattern control device, and may be configured to control, by means of the control circuit, each of the light-transmission units respectively to make the mask to form a required mask pattern.

In specific implementations, on the premise of achieving corresponding functions, detailed configurations and designs of the control circuit, the light conversion layer and the light-transmission units will not affect the protective scope of the present invention. For example, the mask according to the present invention can be presented in various different manners, and correspondingly, the exposure and development methods using this mask may different. A further explanation will be provided in conjunction with the attached drawings.

Figure 2A:
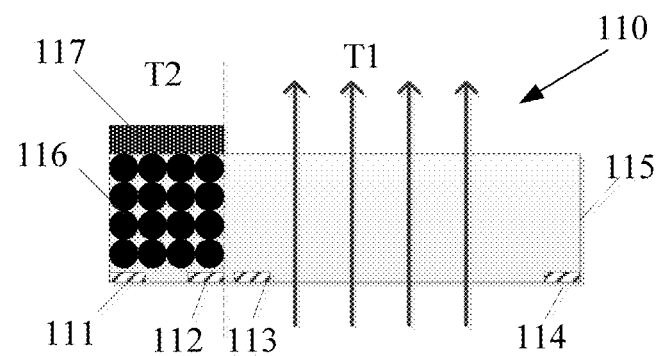
FIG. 2a and FIG. 2b are structural schematic views showing one possible configuration of a light-transmission unit in FIG. 1.
Figure 2B:
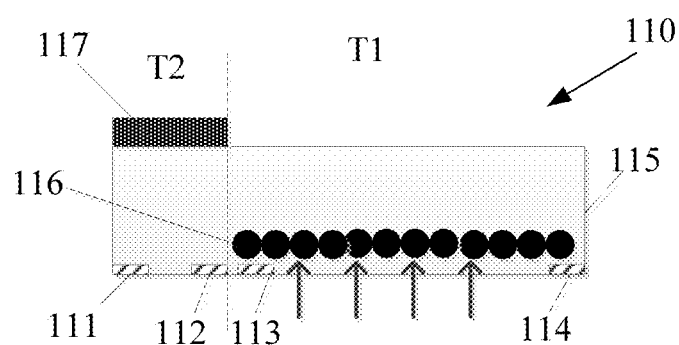

Referring to FIG. 1, FIG. 2a and FIG. 2b, which show structural schematic views of a mask according to an embodiment of the present invention, the mask comprises a pattern control layer 100 and a light conversion layer 200 provided on a light-outgoing directional side or a light-incoming directional side of the pattern control layer 100. For convenience of description, provided that, as shown in FIG. 1, UV light (namely, ultraviolet light) for masking exposure is propagated from bottom to top (shown as arrows in the figure), and, the light conversion layer 200 is provided on the light-incoming directional side of the pattern control layer 100.

As shown in FIG. 1, the pattern control layer 100 comprises a plurality of light-transmission units 110 and a control circuit. Structure of each of the light-transmission units 110 may be referred to FIG. 2a and FIG. 2b. Specifically, each of the light-transmission units 110 comprises a container 115, and electrically charged and shading particles 116 provided in the container 115, and, a first electrode 111, a second electrode 112, a third electrode 113 and a fourth electrode 114 provided on an inner bottom wall of the container 115. In an example, the container 115 can be divided into a light-transmission region T1 and a shading region T2. Within the shading region T2 disposed is shading material 117 by which a shading purpose is achieved. In an example, the first electrode 111 and the second electrode 112 are located within the shading region T2 of the container 115, and the third electrode 113 and the fourth electrode 114 are located within the light-transmission region T1 of the container 115. These electrodes 111, 112, 113 and 114 are parallel to one another, the first electrode 111 is located at a side of the shading region T2 away from the light-transmission region T1 (namely, located at left side within the shading region T2 in FIGS. 2a and 2b), the second electrode 112 is located at a side of the shading region T2 adjacent to the light-transmission region T1 (namely, located at right side within the shading region T2 in FIGS. 2a and 2b), the third electrode 113 is located at a side of the light-transmission region T1 adjacent to the shading region T2 (namely, located at left side within the light-transmission region T1 in FIGS. 2a and 2b), and, the fourth electrode 114 is located at a side of the light-transmission region T1 away from the shading region T2 (namely, located at right side within the light-transmission region T1 in FIGS. 2a and 2b).

The control circuit is connected to the first electrode 111, the second electrode 112, the third electrode 113 and the fourth electrode 114 of each of the light-transmission units 110, and is configured to control voltages applied on the respective electrodes.

When a masking exposure is performed using the mask according to this embodiment, each of the light-transmission units 110 in the mask is controlled by the following manners so as to make the mask to have a given pattern.

When one light-transmission unit 110 is required to be switched to be in a light-transmission state, voltages are respectively applied on the first electrode 111, the third electrode 113 and the fourth electrode 114 while no voltage is applied on the second electrode 112, where, the voltages applied on the third electrode 113 and the fourth electrode 114 are the same while the voltage applied on the first electrode 111 is different from the voltages applied on the third electrode 113 and the fourth electrode 114, so as to introduce the electrically charged and shading particles 116 into the shading region T2 by means of electric potential difference. As a result, electrically charged and shading particles 116 can be introduced into and distributed evenly within the shading region T2. After that, a voltage is applied on the second electrode 112 while the voltages applied on the third electrode 113 and the fourth electrode 114 are turned off, to restrict the electrically charged and shading particles 116 within the shading region T2. At this moment, the state of the light-transmission unit 110 may be referred to FIG. 2a.

When one light-transmission unit 110 is required to be switched to be in a shading state, voltages are respectively applied on the first electrode 111, the third electrode 113 and the fourth electrode 114 while no voltage is applied on the second electrode 112, where, the voltage applied on the first electrode 111 is different from the voltages applied on the third electrode 113 and the fourth electrode 114, so as to introduce the electrically charged and shading particles 116 into the light-transmission region T1 by means of electric potential difference. Meanwhile, the voltages applied on the third electrode 113 and the fourth electrode 114 are the same, so that electrically charged and shading particles 116 can be distributed evenly when they are introduced into the light-transmission region T1. As a result, electrically charged and shading particles 116 introduced into the light-transmission region T1 can be distributed evenly within the shading region T2. After that, a voltage may be or may not be applied on the second electrode 112, to restrict the electrically charged and shading particles 115 within the light-transmission region T1. At this moment, the state of the light-transmission unit 110 may be referred to FIG. 2b.

That is to say, in FIG. 1, the second electrode 112 of the light-transmission units 110 acts as a control gate. When a voltage is applied on the second electrode 112, the electrically charged and shading particles 116 can be stayed stably in their current region, to make correspondingly the mask to have a stable mask pattern. In addition, an evenly electrical field may be obtained since two electrodes 113 and 114 are provided at both sides of the light-transmission region T2, as a result, the electrically charged and shading particles 116 are distributed evenly in the light-transmission region T1. Of course, in a specific implementation, on the premise of achieving the conversion between the light-transmission state and the light-tight state with the help of the control circuit, detailed configurations of the light-transmission units 110 will not affect practice of the present invention and these correspond technical features should fall into the protective scope of the present invention. Here, it should be noted that, according to the present invention, volume of the second electrode 112 is far smaller than those of the third electrode 113 and of the fourth electrode 114, as a result, when the electrically charged and shading particles 116 are restricted within the shading region T2, voltages applied on the third electrode 113 and the fourth electrode 114 can be turned off, thereby saving quantity of electricity.

In a specific implementation, the electrically charged and shading particles 116 mentioned herein can be manufactured using materials such as TiO₂, and the charges applied thereon may be positive, or may be negative.

In addition, in a specific implementation, the abovementioned control circuit may be specifically formed within the shading region T2. For example, the abovementioned control circuit may comprise a plurality of control sub-circuits, and each of the control sub-circuits is provided for a corresponding one of the light-transmission units and is formed within the shading region of the corresponding light-transmission unit.

Again referring to FIG. 1, one optional configuration of the light conversion layer 200 is also shown. The light conversion layer 200 specifically comprises a first conversion layer 210, a second conversion layer 220 located at the light-outgoing directional side of the first conversion layer 210 and a third conversion layer 230 located at the light-outgoing directional side of the second conversion layer 220.

A light-incoming surface of the first conversion layer 210 is in a surface grinding design and is configured to diverge a light incident on the first conversion layer 210 into a surface light source and emit light to the second conversion layer 220.

The second conversion layer 220 is configured to converge the light emitted from the first conversion layer 210 into a plurality of point light sources A and project the plurality of point light sources A onto the third conversion layer 230.

The third conversion layer 230 comprises a plurality of lenses B being in an one-to-one correspondence with the point light sources A and configured to convert the lights emitted from the respective point light sources into parallel lights and emit the parallel lights to the pattern control layer 100.

In a specific implementation, the first conversion layer 210 mentioned herein itself may specifically be a frosted glass. The second conversion layer 220 may be formed on the frosted glass by means of a film formation process (for example a patterning process), as a result, entire thickness of the light conversion layer 200 can be reduced. In addition, the third conversion layer 230 can also be formed on the second conversion layer 220 by means of a film formation process, as a result, entire thickness of the light conversion layer 200 can also be reduced. Of course, in a specific implementation, other configurations of the first conversion layer 210 mentioned herein may be obtained. For example, one scattering layer is manufactured on a common glass substrate and is configured to diverge a light incident on the first conversion layer 210, so that the first conversion layer 210 acts as a surface light source.

It should be understood that, in a specific implementation, each of the point light sources A should be located at a focal spot of its corresponding lens B.

In addition, it should be understood that, although the light conversion layer 20 is illustrated and explained in FIG. 1 to be located at a light-incoming directional side of the pattern control layer 100, in practical applications, the light conversion layer 20 can be located at a light-outgoing directional side of the pattern control layer 100, which also enables the light emitted through the mask to become parallel light. This similar technical solution can also achieve general object of the present invention and should fall into the protective scope of the present invention.

Figure 3:
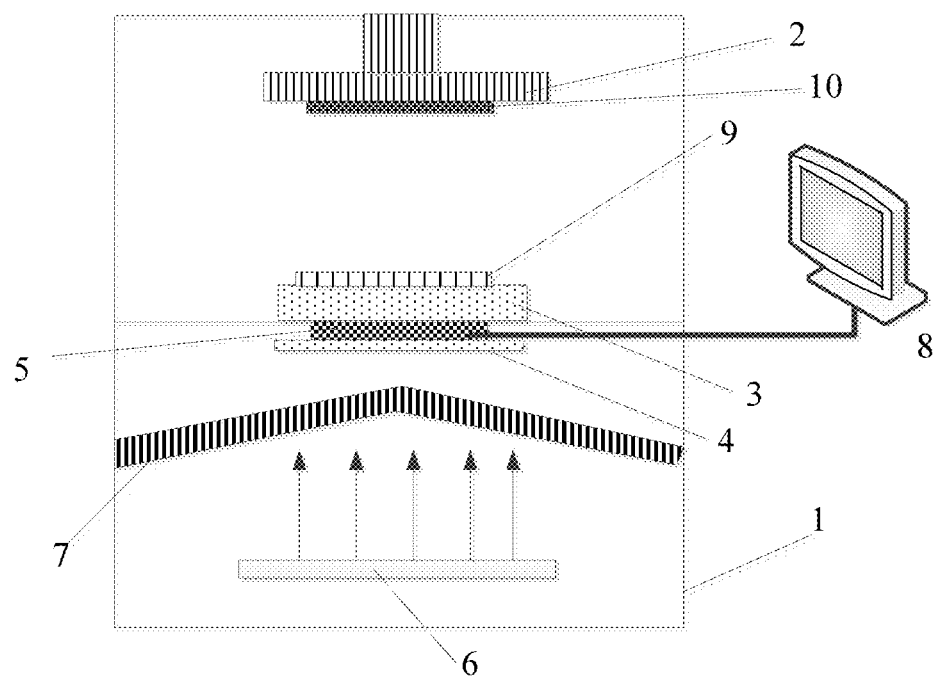
FIG. 3 is a structural schematic view of a masking exposure system according to an embodiment of the present invention.

Based on the abovementioned mask, in embodiments of the present invention, there is also provided a masking exposure system. Referring to FIG. 3, the masking exposure system comprises: a vacuum chamber 1 and a display substrate supporting table 2 disposed in the vacuum chamber 1. An inner wall of the vacuum chamber 1 facing rightly a table top of the display substrate supporting table is formed with a mask window that corresponds in position to the display substrate supporting table 2.

The system further comprises a first quartz substrate 3, a second quartz substrate 4 and the abovementioned mask 5; wherein, the first quartz substrate 3 is configured to cover the mask window, the mask 5 is provided at a face of the first quartz substrate 3 facing away from the display substrate supporting table 2, and the second quartz substrate 4 is provided at a face of the mask 5 facing away from the first quartz substrate 3.

Figure 4:
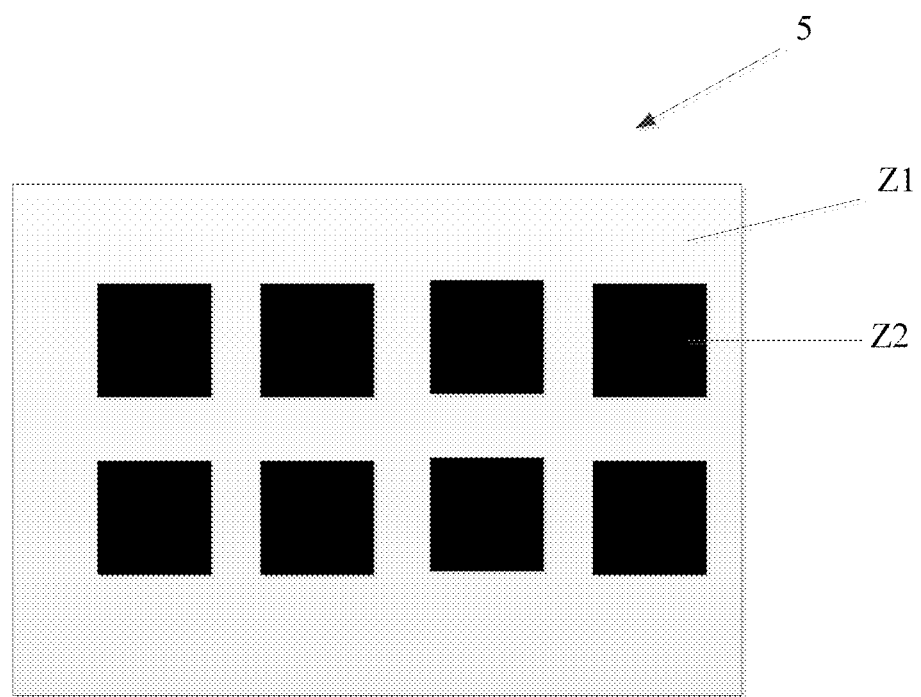
FIG. 4 is a schematic view of a mask pattern possibly presented by the mask pattern 5 according to the present invention.

For convenience of description, FIG. 3 also illustrates a UV lamp 6, a UV lamp shutter 7, a pattern controller 8 configured to control a pattern conversion of the mask 5, a package cover 9 for packaging the mask 5 and the second quartz substrate 4, and a panel board 10 to be exposed. The masking exposure system shown in FIG. 3 can be used in cooperation with the pattern controller 8, to achieve change/replacement of the pattern of the mask without opening the vacuum chamber 1. Referring to FIG. 4, it shows a possible mask pattern achievable by the abovementioned mask 5. The mask 5 comprises a light-transmission region Z1 and a light-tight region Z2. The light-transmission region Z1 is a region within which the light-transmission units are in the light-transmission state under the control of the control circuit, and the light-tight region Z2 is a region within which the light-transmission units are in the light-tight state under the control of the control circuit.

Meanwhile, in the mask system shown in FIG. 3, two quartz substrates 3, 4 are used to protect the mask 5. The mask 5 is under a good protection due to the quartz substrates with good strength. In addition, in a specific implementation, a thickness of the first quartz substrate 3 may be set to be greater than a thickness of the second quartz substrate 4, further enhancing the strength of the first quartz substrate 3, so as to prevent the first quartz substrate 3 to be broken off under atmospheric pressure.

In addition, in the masking exposure system shown in FIG. 3, the mask 5 is provided at a side of the first quartz substrate 3 away from the display substrate supporting table 2, and the first quartz substrate 3 is configured to cover and close the mask window. As a result, in practical applications, the mask 5 can be mounted or adjusted under non-vacuum environment, thereby reducing mounting difficulty of the mask 5.

In a specific implementation, referring to configuration shown in FIG. 3, the mask 5 is arranged at a location at a further distance from the display substrate supporting table 2, or else, the mask 5 may be arranged at a location by a closer distance apart from the display substrate supporting table 2. Specific arrangement of the mask 5 relative to the display substrate supporting table 2 in distance may be variable in accordance with requirements, and these corresponding technical solutions should fall into the protective scope of the present invention.

The mask according to embodiments of the present invention comprises a pattern control layer and a light conversion layer. The pattern control layer comprises a plurality of light-transmission units and a control circuit connected to each of the light-transmission units. The control circuit is configured to control conversion of each of the light-transmission units between in a light-transmission state and in a light-tight state, such that different mask patterns are formed. The light conversion layer is provided on a light-outgoing directional side or a light-incoming directional side of the pattern control layer and is configured to convert incoming light into parallel light so as to emit the parallel light. In this way, the light-transmission units are controlled by means of the control circuit, so that the mask can provide different mask patterns, to allow the mask to be used in different patterning processes, so as to reduce the cost required for manufacturing the mask. Moreover, in the present invention, provision of the light conversion layer, which is configured to convert incoming light into parallel light so as to emit the parallel light, on the light-outgoing directional side or the light-incoming directional side of the pattern control layer is in a good control of locations of the lights incident on the exposed substrate, to improve accuracy of the exposure.

Although these embodiments of the present invention have been shown and described in conjunction with the accompanying drawings, it would be appreciated by those skilled in the art that various changes or modifications may be made in these embodiments without departing from the principles and spirit of the present invention. All of changes and modifications should be included within the scope of the present invention and the scope of which is defined in the claims.

What is claimed is:

1. A mask, comprising:
    a pattern control layer comprising a plurality of light-transmission units and a control circuit connected to each of the light-transmission units, the control circuit being configured to control conversion of each of the light-transmission units between a light-transmission state and a light-tight state such that different mask patterns are formed; and
    a light conversion layer provided on a light-outgoing directional side or a light-incoming directional side of the pattern control layer and configured to convert incoming light into parallel light so as to emit the parallel light;
    wherein:
    each of the light-transmission units comprises a container, and electrically charged and shading particles are provided in the container;
    the container is divided into a light-transmission region and a shading region defined by a projection of a shading material onto the container in a light transmission direction;
    all the electrically charged and shading particles in the container are positively charged particles; and
    the electrically charged and shading particles are selectively moved under control of the control circuit into the light-transmission region to achieve the light-tight state, or into the shading region to achieve the light-transmission state.

2. The mask of claim 1, wherein, a first electrode, a second electrode, a third electrode and a fourth electrode provided on an inner wall, that is perpendicular to a light-incoming direction, of the container; wherein
    the first electrode and the second electrode are located within the shading region of the container, and the third electrode and the fourth electrode are located within the light-transmission region of the container; the first, second, third and fourth electrodes are parallel to one another, the first electrode is located at a side of the shading region away from the light-transmission region, the second electrode is located at a side of the shading region adjacent to the light-transmission region, the third electrode is located at a side of the light-transmission region adjacent to the shading region, and, the fourth electrode is located at a side of the light-transmission region away from the shading region; and
    the control circuit is connected to the first electrode, the second electrode, the third electrode and the fourth electrode of each of the light-transmission units, and is configured to control voltages applied on the respective electrodes.

3. The mask of claim 2, wherein, the electrically charged and shading particles comprise $TiO_2$ particles.

4. The mask of claim 2, wherein, the control circuit comprises a plurality of control sub-circuits, each being formed within the shading region of a corresponding one of the light-transmission units.

5. The mask of claim 1, wherein, the light conversion layer comprises a first conversion layer, a second conversion layer located at a light-outgoing directional side of the first conversion layer and a third conversion layer located at a light-outgoing directional side of the second conversion layer;
    the first conversion layer is in a surface grinding design and is configured to diverge light incident on the first conversion layer into a surface light source and emit light from the surface light source to the second conversion layer;
    the second conversion layer is configured to converge the light emitted from the first conversion layer into a plurality of point light sources and project the plurality of point light sources onto the third conversion layer; and
    the third conversion layer comprises a plurality of lenses being in an one-to-one correspondence with the point light sources and configured to convert the lights emitted from the respective point light sources into parallel light and emit the parallel light.

6. The mask of claim 5, wherein, the first conversion layer comprises a glass substrate, the second conversion layer is formed on the glass substrate by means of a film formation process, and the third conversion layer is formed on the second conversion layer by means of a film formation process.

7. A mask system, comprising: a vacuum chamber and a display substrate supporting table,
    wherein, a wall of the vacuum chamber facing a table top of the display substrate supporting table is formed with a mask window that corresponds in position to the display substrate supporting table; and
    the system further comprises a first quartz substrate, a second quartz substrate and the mask of claim 1; wherein, the first quartz substrate is configured to cover the mask window, the mask is provided on a face of the first quartz substrate facing away from the display substrate supporting table, and the second quartz substrate is provided on a face of the mask facing away from the first quartz substrate.

8. The mask system of claim 7, wherein, a thickness of the first quartz substrate is greater than a thickness of the second quartz substrate.

9. A masking exposure method using the mask of claim 2, the method comprising:
    controlling, by means of the control circuit, each of the light-transmission units respectively, to make the mask to form a required mask pattern.

10. The method of claim 9, wherein, the method comprises:
    moving and distributing evenly the electrically charged and shading particles between the third electrode and the fourth electrode and restricting the electrically charged and shading particles within the light-transmission region in a manner of changing voltages on the first, second, third and fourth electrodes when one light-transmission unit is required to be switched to be in a shading state; and moving the electrically charged and shading particles into the shading region and restricting the electrically charged and shading particles within the shading region in a manner of changing voltages on the first, second, third and fourth electrodes when one light-transmission unit is required to be switched to be in the light-transmission state.

11. A pattern control device, configured to use the mask of claim 1 to implement a pattern control, the pattern control device comprising:

a pattern control unit configured to control, by means of the control circuit, each of the light-transmission units respectively, to make the mask to form a required mask pattern.

12. The mask system of claim 7, wherein, a first electrode, a second electrode, a third electrode and a fourth electrode provided on an inner wall, that is perpendicular to a light-incoming direction, of the container; wherein the first electrode and the second electrode are located within the shading region of the container, and the third electrode and the fourth electrode are located within the light-transmission region of the container; the first, second, third and fourth electrodes are parallel to one another, the first electrode is located at a side of the shading region away from the light-transmission region, the second electrode is located at a side of the shading region adjacent to the light-transmission region, the third electrode is located at a side of the light-transmission region adjacent to the shading region, and, the fourth electrode is located at a side of the light-transmission region away from the shading region; and the control circuit is connected to the first electrode, the second electrode, the third electrode and the fourth electrode of each of the light-transmission units, and is configured to control voltages applied on the respective electrodes.

13. The mask system of claim 7, wherein, in the mask, the electrically charged and shading particles comprise $TiO_2$ particles, and, the control circuit comprises a plurality of control sub-circuits, each being formed within the shading region of a corresponding one of the light-transmission units.

14. The mask system of claim 7, wherein, in the mask, the light conversion layer comprises a first conversion layer, a second conversion layer located at a light-outgoing directional side of the first conversion layer and a third conversion layer located at a light-outgoing directional side of the second conversion layer;

the first conversion layer is in a surface grinding design and is configured to diverge light incident on the first conversion layer into a surface light source and emit light from the surface light source to the second conversion layer;

the second conversion layer is configured to converge the light emitted from the first conversion layer into a plurality of point light sources and project the plurality of point light sources onto the third conversion layer; and the third conversion layer comprises a plurality of lenses being in an one-to-one correspondence with the point light sources and configured to convert the lights emitted from the respective point light sources into parallel light and emit the parallel light.

15. The mask system of claim 14, wherein, in the mask, the first conversion layer comprises a glass substrate, the second conversion layer is formed on the glass substrate by means of a film formation process, and the third conversion layer is formed on the second conversion layer by means of a film formation process.

16. The method of claim 9, wherein, in the mask, a first electrode, a second electrode, a third electrode and a fourth electrode provided on an inner wall, that is perpendicular to a light-incoming direction, of the container; wherein the first electrode and the second electrode are located within the shading region of the container, and the third electrode and the fourth electrode are located within the light-transmission region of the container; the first, second, third and fourth electrodes are parallel to one another, the first electrode is located at a side of the shading region away from the light-transmission region, the second electrode is located at a side of the shading region adjacent to the light-transmission region, the third electrode is located at a side of the light-transmission region adjacent to the shading region, and, the fourth electrode is located at a side of the light-transmission region away from the shading region; and the control circuit is connected to the first electrode, the second electrode, the third electrode and the fourth electrode of each of the light-transmission units, and is configured to control voltages applied on the respective electrodes.

17. The method of claim 9, wherein, in the mask, the electrically charged and shading particles comprise TiO2 particles, and, the control circuit comprises a plurality of control sub-circuits, each being formed within the shading region of a corresponding one of the light-transmission units.

18. The method of claim 9, wherein, in the mask, the light conversion layer comprises a first conversion layer, a second conversion layer located at a light-outgoing directional side of the first conversion layer and a third conversion layer located at a light-outgoing directional side of the second conversion layer;

the first conversion layer is in a surface grinding design and is configured to diverge light incident on the first conversion layer into a surface light source and emit light from the surface light source to the second conversion layer;

the second conversion layer is configured to converge the light emitted from the first conversion layer into a plurality of point light sources and project the plurality of point light sources onto the third conversion layer; and the third conversion layer comprises a plurality of lenses being in an one-to-one correspondence with the point light sources and configured to convert the lights emitted from the respective point light sources into parallel light and emit the parallel light.

19. The method of claim 18, wherein, in the mask, the first conversion layer comprises a glass substrate, the second conversion layer is formed on the glass substrate by means of a film formation process, and the third conversion layer is formed on the second conversion layer by means of a film formation process.

* * * * *